United States Patent [19]

Holler et al.

[11] Patent Number: 4,950,917
[45] Date of Patent: Aug. 21, 1990

[54] SEMICONDUCTOR CELL FOR NEURAL NETWORK EMPLOYING A FOUR-QUADRANT MULTIPLIER

[75] Inventors: Mark A. Holler, Palo Alto; Simon M. Tam, Redwood City; Ronald G. Benson, Pasadena; Hernan A. Castro, Shingle Springs, all of Calif.

[73] Assignee: Intel Corporation, Santa Clara, Calif.

[21] Appl. No.: 283,553

[22] Filed: Dec. 9, 1988

Related U.S. Application Data

[63] Continuation-in-part of Ser. No. 225,035, Jul. 27, 1988.

[51] Int. Cl.$^5$ ............................................... G06G 7/12
[52] U.S. Cl. .................................... 307/201; 307/464; 307/498; 307/529; 364/513
[58] Field of Search ............... 307/201, 464, 465, 478, 307/498, 501, 529; 364/513, 807; 365/184–185

[56] References Cited

U.S. PATENT DOCUMENTS

| | | | |
|---|---|---|---|
| 3,906,296 | 8/1971 | Maserjian et al. | 357/24 X |
| 4,660,166 | 4/1987 | Hopfield | 364/807 |
| 4,695,979 | 9/1987 | Tuvell et al. | 365/185 |
| 4,742,492 | 5/1988 | Smayling et al. | 365/185 X |
| 4,760,437 | 7/1988 | Denker et al. | 357/30 |
| 4,773,024 | 9/1988 | Faggin et al. | 364/513 |
| 4,782,460 | 11/1988 | Spencer | 307/201 X |
| 4,873,661 | 10/1989 | Tsividis | 364/807 |
| 4,874,963 | 10/1989 | Alspecfor | 307/201 |
| 4,875,183 | 10/1989 | Graf et al. | 307/201 X |

FOREIGN PATENT DOCUMENTS

| | | |
|---|---|---|
| 0040251 | 11/1980 | European Pat. Off. . |
| 0121464 | 3/1984 | European Pat. Off. . |
| 0138439 | 9/1984 | European Pat. Off. . |
| 2049278 | 4/1980 | United Kingdom . |

OTHER PUBLICATIONS

"Programmable Analog Synapses for Microelectronic Neural Networks Using a Hybrid Digital-Analog Approach", by F. J. Mack, K. K. Moon, C. T. Yao and J. A. Modolo.
"Artificial Neurons Using Analog Multipliers", by Paul W. Hollis and John J. Paulos.
"Analysis and Design of Analog Integrated Circuits", by Paul R. Grey and Robert G. Meyer.

Primary Examiner—David Hudspeth
Attorney, Agent, or Firm—Blakely, Sokoloff, Taylor & Zafman

[57] ABSTRACT

A synapse cell for use in providing a weighted connection strength is disclosed. The cell employs a four-quadrant multiplier and a pair of floating gate devices. Various charge levels are programmed onto the floating gate devices, establishing weight and reference levels. These levels affect the current flowing through the multiplier. The output of the cell thus becomes a multiple of the input and the programmed charge difference.

19 Claims, 6 Drawing Sheets

FIG_1 (PRIOR ART)

FIG_2A

FIG_2B

FIG_3

FIG_4A

FIG_4B

FIG_5

$$I_D = \left[V_G - V_T - \frac{Q_{FG}}{C_{FG}}\right]V_{DS}$$

$$net_j = \sum_i w_{ji} u_i$$

FIG_6

$$I_{D_e} = \left( \frac{Q_{FG_e}}{C_{FG_e}} - V_{TH} \right)\left(u_i - V_T\right)$$

$$I_{D_i} = \left( \frac{Q_{FG_i}}{C_{FG_i}} - V_{TH} \right)\left(u_i - V_T\right)$$

FIG_9

SEMICONDUCTOR CELL FOR NEURAL NETWORK EMPLOYING A FOUR-QUADRANT MULTIPLIER

CROSS REFERENCE TO RELATED APPLICATIONS

This is a continuation-in-part of application Ser. No. 225,035 filed July 27, 1988.

FIELD OF THE INVENTION.

The invention relates to the field of semiconductor cells, particularly those having floating gate members.

PRIOR ART.

Several circuit models have been proposed in an attempt to duplicate the logic performed by the human brain and the brains of other animals. These models provide for both learning (e.g., a programming mode) and decision making (e.g., recognition, associative memory). Often the modeling requires vast amounts of computation and complex computer programs. Even attempts at employing custom VLSI have resulted in relatively complex circuits. For a general discussion of neural networks, see "A Neuromorphic VLSI Learning System", by Alspector and Allen, Advanced Research in VLSI, *Proceedings of the* 1987 *Stanford Conference.*

FIG. 6 of the Alspector paper shows a typical neuron or cell. A neuron includes dendrites (inputs), synapses (connections), neuron body (summing amplifier) and axon (output). The synapses are simply represented by resistors in FIG. 1 of this application for purposes of discussion. It is these cells and synapses which are described in the present application.

In the prior art these cells sometimes include digital registers and digital-to-analog converters to provide a weighting factor or function. Other means are provided to multiply an input signal by this factor. Thus, each cell of the network requires a substantial amount of circuitry and even with current VLSI technology, a large number of cells (e.g., 10,000) cannot be fabricated on a single chip.

Other prior art known to Applicant is "An Associative Memory Based on an Electronic Neural Network Architecture" by R. Howard et al, *IEEE Transactions on Electronic Devices*, Vol. ED 34- July, 1987; "An Artificial Neural Network Integrated Circuit Based on MNOS/CCD Principles" by J. Sage, *Neural Network for Computing*, AIP Conference Proceedings, 1986; and, "A 20 V Four-Quadrant CMOS Analog Multiplier", by J. Babanezhad, *IEEE Journal of Solid-State Circuits*, Vol. SC-20, Dec., 1985; "Programmable Analog Synapses for Microelectronic Neural Networks Using a Hybrid Digital-Analog Approach", by F. J. Mack, K. K. Moon, C. T. Yao and J. A. Modolo, submitted to IEEE Int'l Conference on Neural Networks, July 24–27, 1988 San Diego, CA; "Artificial Neurons Using Analog Multipliers" by Paul W. Hollis and John J. Paulos (distributed at the IEEE Int'l Conference on Neural Networks in San Diego, 1988).

As will be seen, the present invention uses floating gate memory devices in the cells to provide the weighting factor or function and analog multiplication of an input by the weighting factor. There are numerous floating gate memory devices well-known in the prior art. For example, see U.S. Pat. Nos. 3,728,695; 3,755,721; 3,984,822; 4,142,926; 4,203,158; 4,412,310; 4,460,982; 4,519,849; and U.S. patent application, Ser. No. 667,905, filed Nov. 2, 1984, entitled Low Voltage $E^2$ PROM Memory. These patents and application discuss cells for electrically programmable read-only memories (EPROMs), electrically erasable and electrically programmable read-only memories (EEPROMs), flash EPROMs, and related circuitry. The present invention also uses either a four-quadrant multiplier or a Gilbert multiplier for analog multiplication of an input by the weighting factor. The use of such multipliers in analog circuitry is well-known in the prior art. For example, see "Analysis and Design of Analog Integrated Circuits", by Paul R. Grey and Robert G. Meyer, John Wiley and Sons, New York (1977).

There are prior art EPROM cells that have floating gates which extend to read devices. These are used to speed-up the reading of these cells.

SUMMARY OF THE INVENTION

An improved synapse cell for use in a neural network is described which includes a four-quadrant multiplier having two pairs of differentially-coupled field-effect devices for receiving a differential input and producing a differential output. The cell further includes a pair of floating gate memory devices, each having a floating gate which may be programmed to a predetermined electrical charge level. Each of the floating gates extends to and becomes the control gate of another field-effect device whose drain is connected to the sources of one of the differentially-coupled pairs. In this manner, the current flowing through each half of the multiplier becomes a function of the charge stored on the floating gates. The output signal obtained is thus a multiple of the input signal and the difference in charge residing on the floating gates.

BRIEF DESCRIPTION OF THE DRAWINGS

FIG. 2b is a cross-sectional elevation view of a substrate illustrating a part of the cell of FIG. 2a.

FIG. 4b shows waveforms used by the cell of FIG. 4a.

DETAILED DESCRIPTION OF THE INVENTION

A semiconductor cell employing floating gate memory devices and the like, particularly suited for neural networks is described. In the following description, numerous specific details are set forth such as specific conductivity types in order to provide a thorough understanding of the present invention. It will be obvious, however, to one skilled in the art that these specific details need not be used to practice the present invention. In other instances, well-known structures and circuits have not been shown in detail in order not to unnecessarily obscure the present invention.

PRIOR ART NEURAL NETWORK

Figure 1:
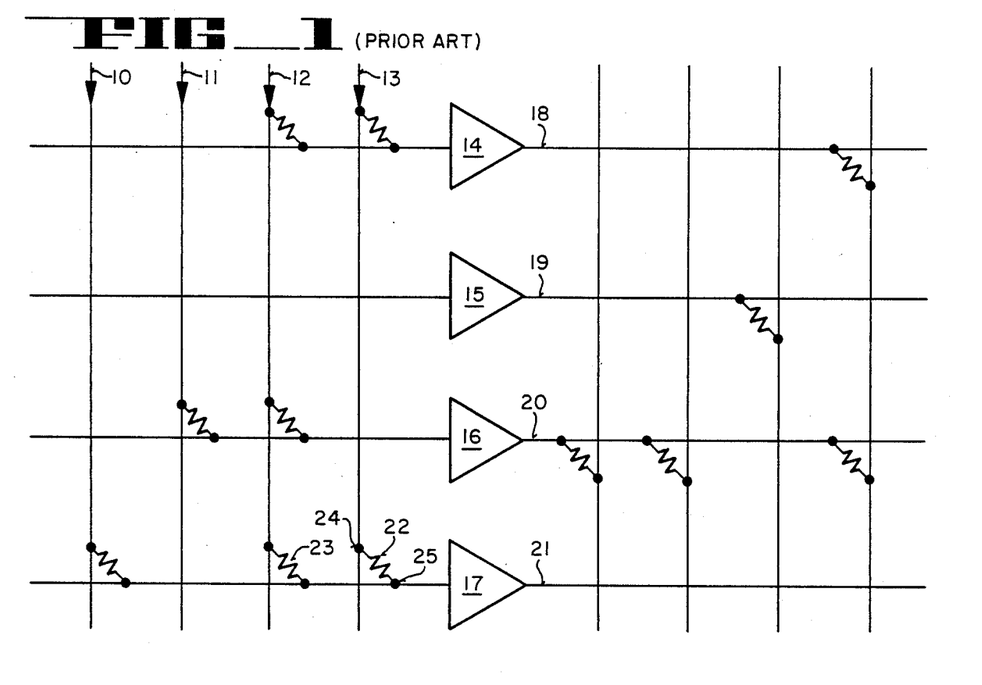
FIG. 1 illustrates a typical prior art neural network, this figure is used to show the placement of the invented cells in a neural network.

In FIG. 1 a portion of a prior art neural network is illustrated. Inputs (e.g., stimuli) to the network are applied on lines 10, 11, 12 and 13. These inputs are coupled via resistors to the input terminals of the current summing amplifiers 14, 15, 16 and 17. The output of each of these amplifiers, lines 18, 19, 20 and 21 provide output signals that are coupled via resistors to the inputs of current summing amplifiers in the next layer of the neural network. Input signals provide contributions to the output signals through resistors which are analogous to the synapses in biological neurons. For example, consider the input to amplifier 17. The signals on line 10, 12 and 13 are coupled to the amplifier 17 through resistors. More specifically, and by way of example, the potential at node 24 contributes a current to the input of amplifier 17 through the resistor 22. The resistors in the simplest case may be either "short circuits" or "open circuits", or the resistors may have values (in some cases binary weighting is used).

At first glance the network of FIG. 1 seems relatively easy to implement, but in reality it is a difficult network to realize particularly for an integrated circuit. For one thing, it is difficult to fabricate a plurality of resistors having different resistances especially if the values of the resistors are to be "programmed" into the network after the network is fabricated. (The values of each of the resistors represents the "learning" and can be determined in several ways as taught by the prior art. For some applications the values of these resistors remain fixed for a decision making mode of the network as opposed to a learning mode.)

The present invention focuses on providing a cell which replaces the resistors such as the resistors 22 and 23. Note that each resistor can be considered to have an input (e.g., node 24 for resistor 22) and an output (e.g., node 25 for resistor 22). Ideally, the resistor 22 should be able to be programmed to a predetermined value after the network is fabricated and this value should be non-volatility stored by the cell.

PRINCIPLE OF OPERATION OF THE PRESENT INVENTION

Figure 2A:
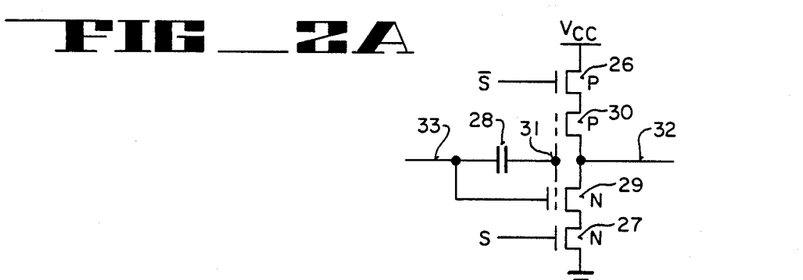
FIG. 2a is an electrical schematic of a cell employing the teachings of the present invention.
Figure 2B:
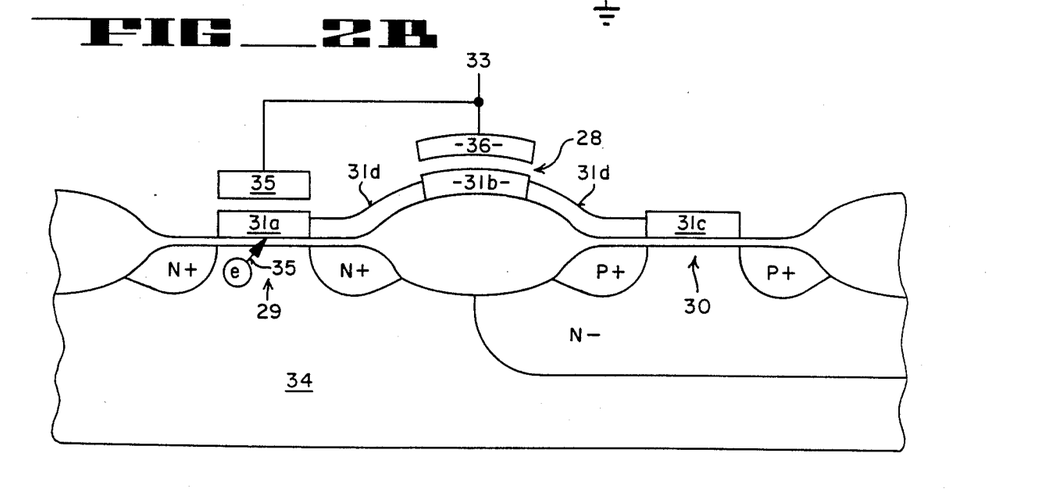
Figure 5:
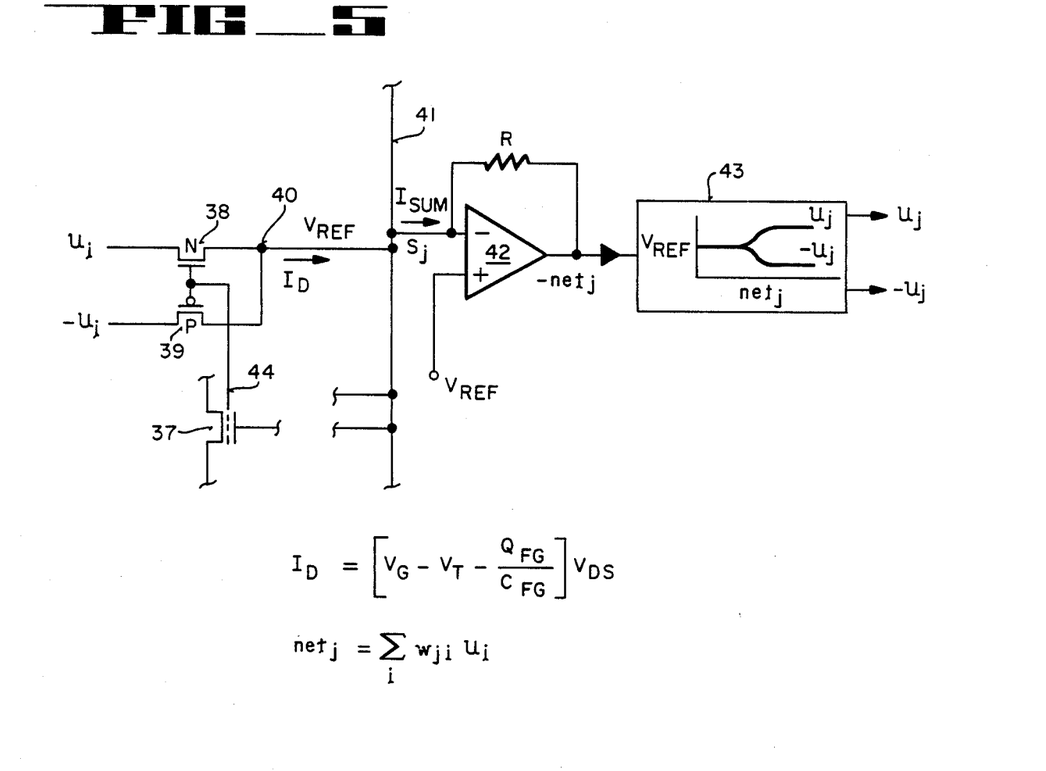
FIG. 5 is still another embodiment of the invented cell, used to illustrate the weighting function performed by the invented cell.

FIGS. 2a, 2b and 5 best illustrate the manner in which the present invention operates. The present invention makes use of well-known prior art memory cells which have members that are electrically charged. Most often, these cells employ polysilicon floating gates which are completely surrounded by insulation (e.g., silicon dioxide). Charge is transferred to these floating gates through a variety of mechanisms such as avalanche injection, channel injection, tunnelling, etc. The charge on the floating gate affects the conductivity in the cell and if the conductivity is above a certain level, the cell is deemed to be programmed in one binary state, and if the conductivity is below another level, it is deemed to be programmed in the other binary state. These memory cells take a variety of forms in the prior art, some being both electrically erasable and electrically programmable and others requiring for example, ultraviolet light for erasing. The cells are incorporated into memories referred to in the prior art as EPROMs, EE-PROMs, flash EPROMs and the specific cells are referenced in the prior art section of this application.

The present invention employs these prior art cells, however, with the present invention, the charged member (i.e., floating gate) is extended beyond the prior art memory cell to a second device or pair of devices. The charge on the floating gate is used to control the current flow in the second device.

Referring to FIG. 2a, a n-type EPROM cell 29 is shown coupled in series with a p-channel device 30. Device 30 is coupled to $V_{CC}$ through p-channel transistor 26; and, device 29 is coupled to ground through n-channel transistor 27. The device 29 as shown in FIG. 2b includes a pair of spaced-apart n+regions disposed in a p-type substrate 34. A section 31c of a floating gate 31 is disposed above the channel defined by the spaced-apart p-type regions. A control gate 35 is insulated from and disposed above the floating gate 31. Generally, the floating gate 31 (which includes section 31a, 31b and 31c) is fabricated from polysilicon and is completely surrounded by silicon dioxide or other insulative material. As illustrated in FIG. 2b, charge is injected into the floating gate 31, by way of example, by channel injection from the channel of device 29 as illustrated by arrow 35. The charging and discharging of the floating gate may occur in a manner well-known in the prior art.

The second field device 30 shown in FIG. 2a generally comprises a field-effect transistor with the gate 31 (section 31c) extending to above the channel region of device 30. In FIG. 2b the p-channel device 30 is shown fabricated in an n-type well and includes a pair of spaced-apart p-type regions. The gate 31 extends over the channel defined by the p-type regions. It is apparent that charge on the floating gate 31 provides an electric field which will affect the current flow between the p-type regions of device 30.

A field oxide region separates devices 29 and 30. A capacitor 28 is formed on this oxide. The capacitor comprises section 31b of the floating gate 31 and member 36 separated by an oxide layer. The capacitor 28 provides additional coupling between the floating gate 31 and control gate 35a. This coupling is needed for programming the floating gate.

With some MOS processes sections 31a, 31b and 31c of gate 31 can be formed from a continuous layer of polysilicon. With other processes, one (or more) of the sections are formed from different layers of polysilicon and interconnected with contacts. The contacts are illustrated by leads 31d in FIG. 2b. These contacts are typically formed spaced-apart from the active channel regions of devices 29 and 30. In either event, the gate 31 (all sections) is completely surrounded by oxide as such floating gate typically are in EPROMs.

Assume for purposes of discussion that a positive potential is applied to the drain regions of device 29 and that the source region of device 29 is coupled to ground through transistor 27. If charge (electrons) is transferred into gate 31, device 29 becomes less conductive whereas device 30 becomes more conductive. On the other hand, if the floating gate is not charged, device 29 more readily conducts while device 30 is less conductive. Note during charging line 33 is positive and capacitor 28 provides coupling to gate 31 allowing the gate to be charged. If line 33 is ramped from zero to $V_{CC}$ and the current into line 32 measured, it can be determined how much charge is present on the floating gate. During sensing S is positive (an input to the cell).

The cell of FIGS. 2a and 2b, while useful in a neural network, can also be used in other applications. For instance, in memories that have redundant elements such as rows or columns which replace defective rows or columns, and where programmable decoders are used to select the redundant rows or columns, the cell of FIGS. 2a and 2b may be used in the programmable decoders. An example of such programmable row decoders is shown in U.S. Pat. No. 4,250,572.

When the cell of FIGS. 2a and 2b is used in a neural network it is used to multiply the input signal "S" by the charge on the floating gate. The amount of charge on the floating gate and its use as a weighting factor is discussed in conjunction with FIG. 5. An input to the cell of FIGS. 2a and 2b in a neural network where the cell is replacing a resistor of FIG. 1 is "S" and "S1" and the output is present on line 32.

Another cell is shown in FIG. 5. This cell has the ability to provide multiplication where the input is other than a one or zero; that is, the analog input is multiplied by a weighting factor. The weighting factor again is determined by, or represented by, the amount of charge on the floating gate. The charging of the floating gate to the desired level is discussed in conjunction with the embodiment of FIG. 4a. That discussion applies to all embodiment.

In the cell of FIG. 5 (shown to the left of line 41), a floating gate device 37 is used which may again be a EPROM, EEPROM, flash EPROM, etc., memory cell. Its floating gate 44 extends to and becomes gate members for an n-channel device 38 and a p-channel device 39. Devices 38 and 39 are similar to ordinary field-effect transistors except that their gates are extensions of the floating gate of device 37. The charge on the floating gate controls the current flow in the channels of devices 38 and 39. One terminal of device 38 and one terminal of device 39 receives an input signal ($U_I$ and $-U_I$ respectively). The other terminals of devices 38 and 39 are coupled to a node 40. The line 41 provides an input to the operational amplifier 42. The line 41 and the positive terminal of the amplifier 42 are held at a reference potential. Effectively, currents are summed (from a plurality of cells) on line 41 to provide the input to amplifier 42 ($I_{SUM}$) with the contribution to this sum for the illustrated cell being shown as $I_D$. The output of the operational amplifier is a voltage equal to $V_{REF}$ minus the product of $I_{SUM}$ and R. This voltage is coupled to a signal conditioning circuit 43 which provides positive-going and negative-going signals proportional in magnitude to $I_{SUM}$ and centered about the reference potential as illustrated. Ordinary, well-known circuits may be used for circuit 43.

The cell of FIG. 5 may be coupled into the neural network of FIG. 1 by replacing the resistors of FIG. 1 with the devices 37, 38 and 39. For example, if these devices replace resistor 22, node 25 of FIG. 1 is effectively node 40 of FIG. 5 and the summing shown on line 41 of FIG. 5 represents the summing that occurs at the input to amplifier 17 of FIG. 1. For this example, the output of the signal conditioning circuit 43 of FIG. 5 is a pair of lines that replace line 21 of FIG. 1. Importantly, the current $I_D$ is a function of the charge on the floating gate of the device 37 as indicated by the equation shown for $I_D$ in FIG. 5. The quantities within the bracket are the weighting function $W_{ji}$; and, $V_{DS}$ is the voltage between the drain and source. For the embodiment illustrated where one terminal of devices 38 and 39 are held at a reference potential, $V_{DS}$ is the input signal. The summation on line 41 ($net_j$) is equal to the sum of products of each cell's weighting factor and input signal. The quantities within the bracket representing the weighting factor includes $V_G$, the potential on the upper gate such as the upper gates 35 and 36 shown in FIG. 2b. $V_T$ is the threshold voltage of device 38 or 39 depending on whether the cell is programmed for excitation or inhibition. $Q_{FG}/C_{FG}$ is the voltage on the floating gate due to the charge stored on the floating gate. Ideally, for $I_D$ to be the product of the weighting factor and input, $V_T$ should be close to zero volts. This, of course, can be achieved by doping the channel of the devices 38 and 39 to obtain a close to zero threshold voltage. There is a dead zone in floating gate voltage where the weighting is equal to zero for the illustrated embodiment that occurs between the threshold voltage of the p-channel device (negative potential) and the threshold voltage of the n-channel device (positive potential). This dead zone requires a large programming pulse when changing the polarity of the weighting. Also, for small weights and/or very large input voltages linearity is lost and hence, there is a limited ideal range for inputs and weights where ideal multiplication is achieved. Or put another way, there is a limited dynamic range for inputs and weights.

EMBODIMENT OF FIG. 3

Figure 3:
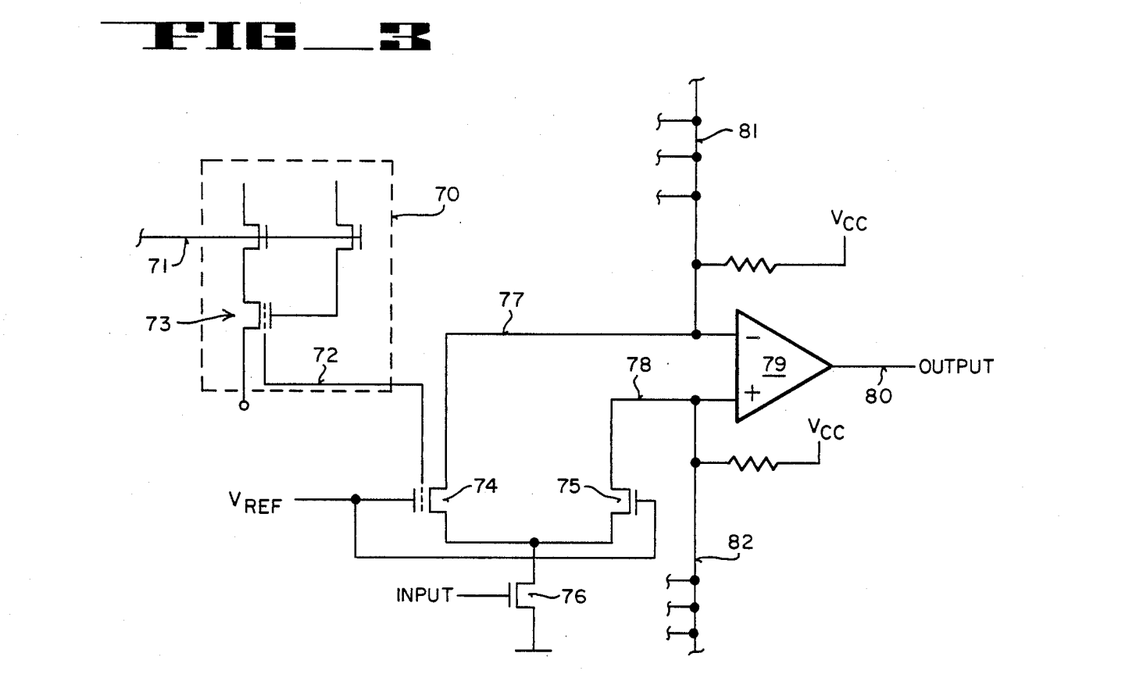
FIG. 3 is an electrical schematic of an embodiment of the invented cell.

The embodiment of FIG. 3 solves certain of the problems such as the limited dynamic range discussed for the cell of FIG. 5. The cell of FIG. 3 again includes a floating gate device 73 which is coupled in series with a transistor used for charging the floating gate of device 73. An additional transistor is coupled to the control gate of device 73. By application of a potential to line 71 and one terminal of device 73 (in addition to power supply potential) the floating gate 72 of device 73 may be charged to a predetermined level discussed below for the embodiment of FIG. 4. The floating gate of device 73 extends to and is part of the field-effect device 74 in the manner described for the cell of FIG. 2.

Devices 74 and 75 each have one of their terminals coupled to the differential inputs of the amplifier 79. Specifically, line 77 is coupled to the negative terminal of the amplifier and line 78 to the positive terminal. The other terminals of field-effect devices 74 and 75 are coupled to the field-effect device 76. This device receives an input signal on its gate.

The operational amplifier 79 receives inputs from other cells. For example, the equivalent of line 77 of other cells are coupled to line 81 and the equivalent of line 78 of other cells are coupled to line 82. The output of amplifier 79 (line 80) as described above provides an input to other cells. The devices 74, 75 and 76 are all of the same conductivity type for the embodiment illustrated. The amplifier 79 amplifies the current difference on lines 78 and 79. If for a moment the effect on device 74 of the charge in floating gate 72 is ignored, and devices 74 and 75 are assumed to be identical, then for any input to the device 76, the differential current is zero. This represents a weighting factor of zero. As charge is placed on the gate 72, the differential current between devices 74 and 75 increases (assuming line 81 and 82 are held at a constant potential) and the amount of this difference is multiplied by the input signal applied to device 76.

Therefore, the output of amplifier 80 represents the input signal applied to the cell at the gate of device 76 multiplied by the weighting factor (charge on a floating gate 72).

EMBODIMENT OF FIG. 4

Generally in the prior art, floating gate memory devices are charged (and erased) with a series of pulses. After pulses are applied, the conductivity of the device is examined to determine if the floating gate is charged (or erased). If it is not, additional charging occurs by applying more pulses to the device. With the present invention, charge on the floating gate is monitored to determine when the charge level is at the desired level, that is, at the level needed for a particular weighting factor.

Figure 4A:
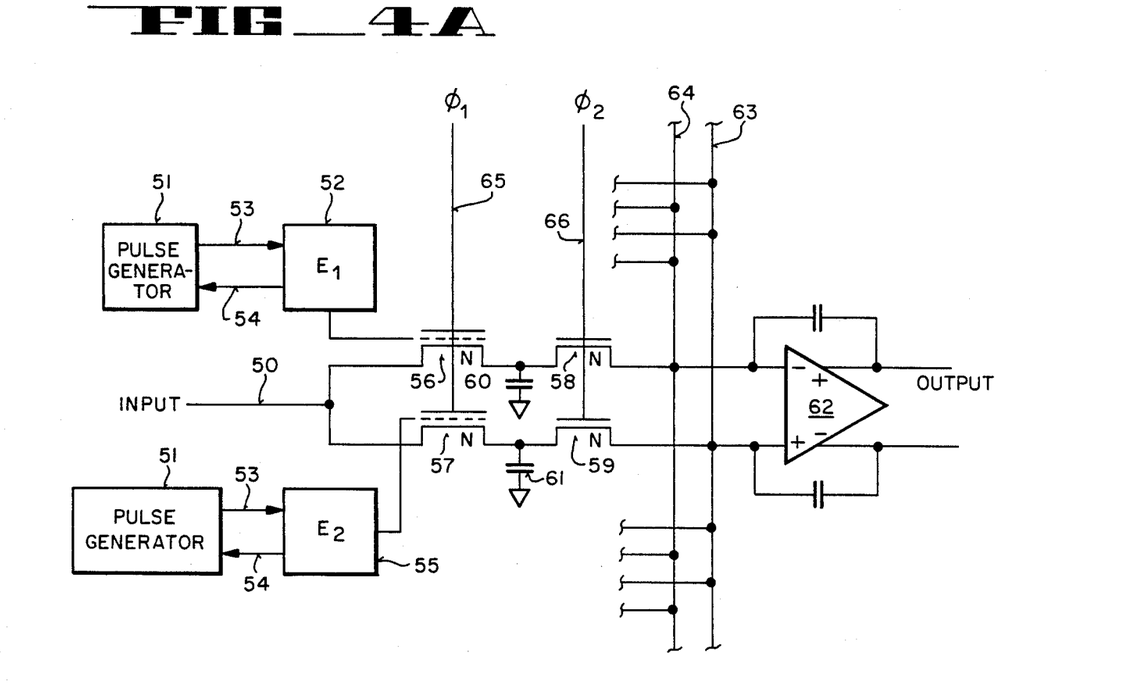
FIG. 4a is an electrical schematic of another embodiment of the invented cell.

FIG. 4a shows pulse generators 51 coupled to floating gate devices 52 and 55. The pulses used for charging these devices are coupled to the devices on lines 53. The amount of charge is determined indirectly by monitoring the threshold voltage of the floating gate device or the threshold voltage of the second device which shares the floating gate. This monitoring is shown by lines 54. Ordinary, well-known circuits may be used for generating the pulses and for monitoring the voltages to determine the level of charge on the floating gate.

In effect, the amount of charge on the floating gate, as will be seen, determines the value of the resistors or synapses in the neural networks such as resistors 22 and 23 of FIG. 1.

The cell of FIG. 4 operates in a dynamic mode and therefore consumes less power. It is particularly useful where the input is either a one or a zero. Two floating gate devices are used in this embodiment illustrated as E1 (52) and E2 (55). Again, these devices may be cells for EPROM, EEPROM, flash EPROM, etc. As previously discussed, a pulse generator is shown coupled to device 52 for charging this device. Such a generator would also be associated with E2 as well as the other floating gate devices previously described. The input line 50 is coupled to the input terminals of the amplifier by two separate paths. One path includes devices 56 and 58, the other devices 57 and 59. The floating gate of device 52 extends into device 56; similarly, the floating gate of device 55 extends into device 57 such as shown in FIG. 2. A capacitor 60 is present between devices 56 and 58 and similarly, capacitor 61 is present between devices 57 and 59.

Figure 4B:
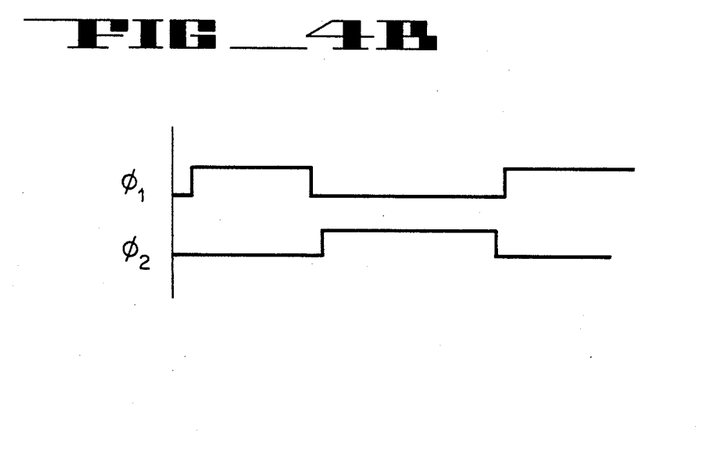

For the n-channel embodiment illustrated, positive waveforms are applied to lines 65 and 66. As shown in FIG. 4b, line 65 is first brought high (while line 66 is low), permitting capacitors 60 and 61 to be charged. Then, after the potential on line 65 has been brought low, line 66 is brought high, permitting the charge from these capacitors to be coupled through devices 58 and 59 to the operational amplifier 60. Charge from other cells is also coupled to amplifier 62 by lines 63 and 64.

For the embodiment of FIG. 4a, the weighting factor is determined by the difference in charge stored on the floating gate devices 52 and 55. For instance, if both floating gates have the same charge, both devices 56 and 57 will pass the same input current for a given signal on line 50. Capacitors 60 and 61 will charge to the same level and the same amount of charge will be coupled to amplifier 62. This differential amplifier for this case will provide a zero difference at its output lines. The greater the difference in charge on the floating gates of devices 52 and 55, the greater the weighting factor becomes. The output of the amplifier 62 may be converted to a binary signal where needed using ordinary circuits to provide an input to other cells in a neural network.

EMBODIMENT OF FIG. 6

Figure 6:
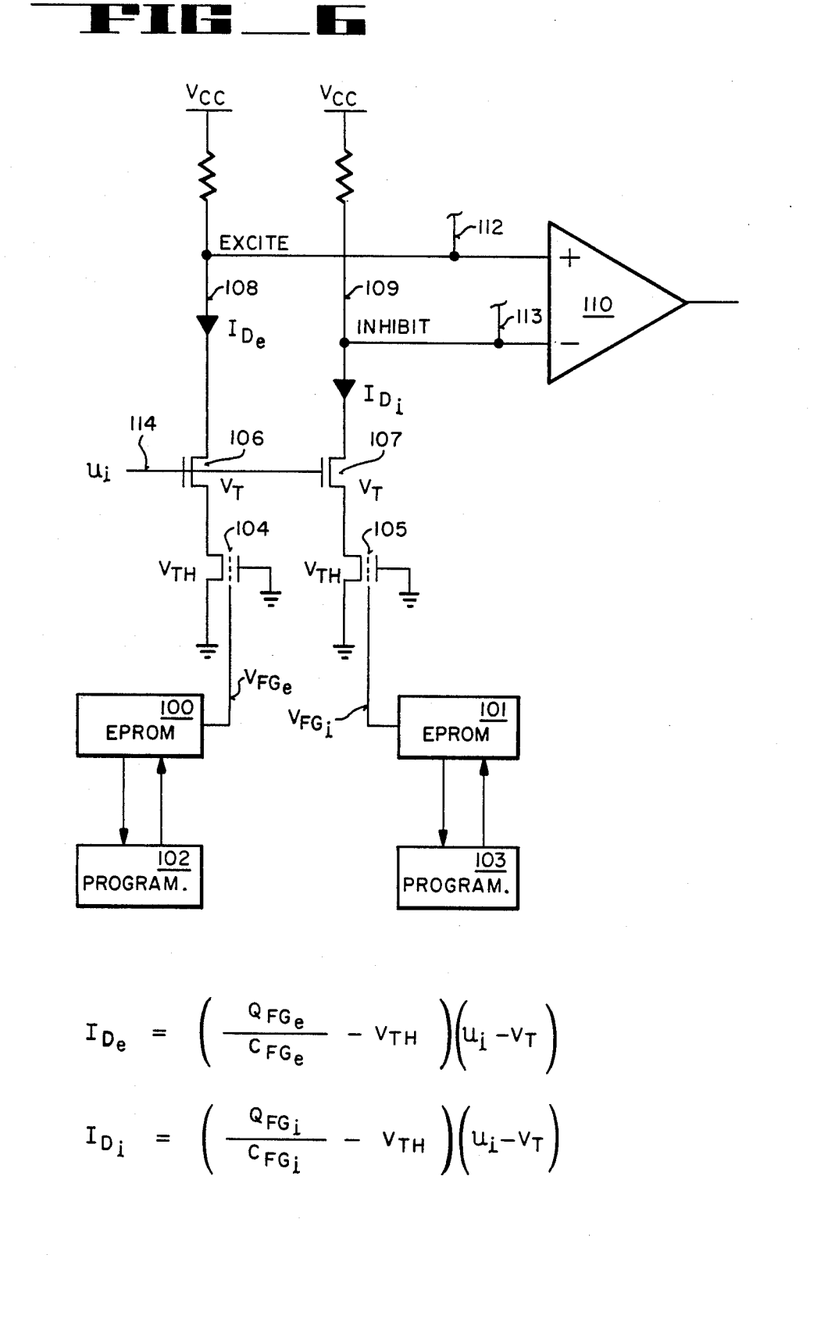
FIG. 6 is an electrical schematic of another embodiment of the invented cell.

The embodiment of FIG. 6 has the advantage of having devices of a single conductivity type, for example, all n-channel devices. The cell includes a pair of floating gate memory devices shown as EPROMs 100 and 101. These may be ordinary devices as discussed for the other embodiments with floating gates that extend into devices 104 and 105. Pulse generators 102 and 103 are used to program the gates of devices 100 and 101, respectively to the desired charge level to obtain a weighting factor as in other embodiments.

The floating gates from devices 100 and 101 extend over the channel region of devices 104 and 105, respectively. The charge on these gates thus control the current $I_{De}$ (line 108) and $I_{Di}$ (line 109). The control gates of devices 104 and 105 are coupled to ground; accordingly, $V_{FGe}$ and $V_{FGi}$ are zero before any charge is added to or removed from the floating gate of devices 104 and 105. Devices 104 and 105 are coupled in series with transistors 106 and 107, respectively. An input to the cell is applied on line 114 and is shown as $U_i$. Preferably the threshold voltage of devices 104, 105, 106 and 107 are close to zero volts, then $V_{TH}$ and $V_T$ are approximately zero. For this cascaded embodiment devices 106 and 107 are relatively wide devices and have low body effect.

$I_{De}$ (exciting current) and $I_{Di}$ (inhibiting current) are coupled to the differential amplifier 110. The floating gates of devices 100 and 101 are charged to different levels to obtain larger weighting functions. Note a large positive charge on the floating gate of device 101 causes more current $I_{Di}$ which increases the output of amplifier 110. A large positive charge on the floating gate 100 tends to decrease the output of amplifier 110. The equations for $I_{De}$ and $I_{Di}$ are shown in FIG. 6. Again the weighting factor is proportional to the charge on the floating gate and is multiplied by an input voltage from another amplifier.

Summing from other cells occurs at the input to amplifier 110. Lines 112 and 113 illustrate inputs from other cells.

EMBODIMENT OF FIG. 7

Figure 7:
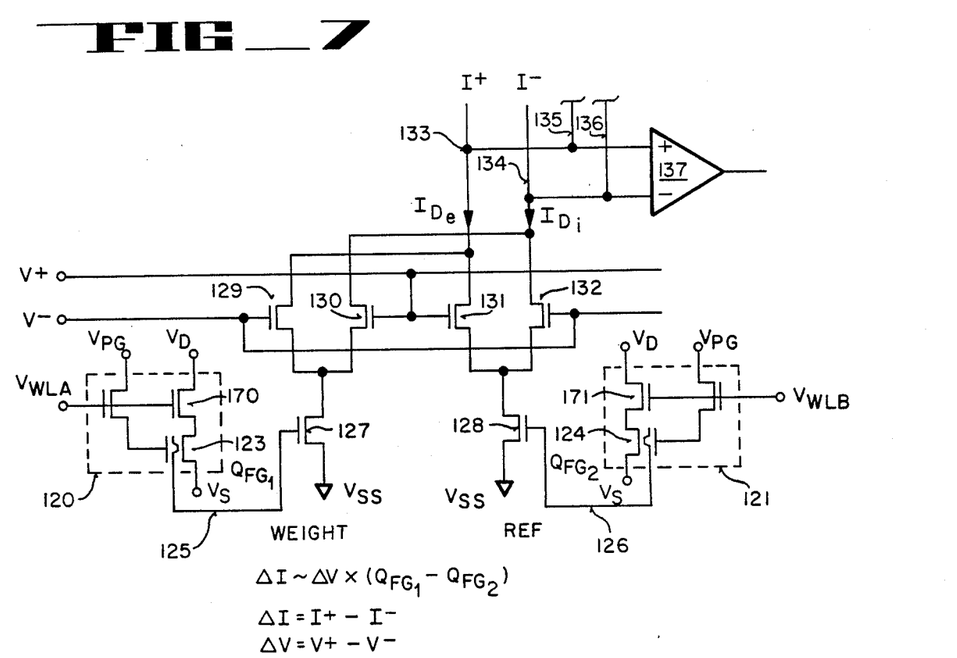
FIG. 7 is an electrical schematic of the preferred embodiment of the present invention.

A programmable synapse approach using a fully differential four-quadrant multiplier is shown in FIG. 7. The multiplier of FIG. 7 is actually a simplification of a Gilbert multiplier having a reduced device count and less $V_{CC}$ range. The operational principles of the four-quadrant multiplier, and the Gilbert multiplier, are very well-known in the prior art. For instance, a discussion of these devices can be found in "Analysis and Design of Analog Integrated Circuits", by Paul R. Grey and Robert G. Meyer, John Wiley and Sons, New York, p. 554–603, (1977), incorporated herein by reference.

The four-quadrant differential approach has a significant advantage over most other programmable synapses in terms of a higher signal processing bandwidth, a high input impedance and better control of biasing. Because the cell operates differentially, common-mode fluctuations in either the input levels or the floating gate voltages will not have a large effect on the accuracy of the multiplication. Additional features of the four-quadrant differential multiplier approach are improved multiplication linearity, especially for small weights and inputs, and an ability to set weights to zero without having to exactly match the charge on the floating gate devices. Furthermore, this approach doubles the storage capacity of the synapse.

The cell of FIG. 7 includes floating gate devices 123 and 124 each of which is coupled in series with a transistor used for charging the floating gate of those devices. Additional transistors are also coupled to the control gates of devices 123 and 124 to facilitate the charging of the floating gates. This completes the formation of floating gate charging devices 120 and 121. It is appreciated that alternative circuits employing floating gate devices may be substituted for charging devices 120 and 121 without detracting from the scope or spirit of the present invention.

During programming, the floating gate of device 123 is charged to a predetermined level by applying positive potentials to the word line $V_{WLA}$ and the program line $V_{PG}$ (in addition to normal power supply potentials). Charge accumulated on the floating gate of device 123 is then transferred to the gate of field-effect device 127 via line 125. In the preferred embodiment, line 125 is actually an extension of the floating gate of device 123, rather than a separate interconnect. The charge on line 125, $Q_{FG1}$, represents the synapse weight. In a similar fashion, line 126 may be charged to a predetermined reference level, represented by $Q_{FG2}$, by raising the potentials on lines $V_{WLB}$ and $V_{PG}$. Thus, weight and reference charges may be programmed into the synapse cell of FIG. 7.

The use of charging device 121, which is identical to that of 120, is an important design consideration in the embodiment of FIG. 7. Unlike alternative biasing means for establishing a reference potential on line 126, device 121 "tracks" device 120 across fluctuations in temperature, noise, biasing and processing. Such fluctuations commonly occur in an integrated circuit environment. With matched charging devices 120 and 121, a stable difference between the weight and reference lines is maintained, thereby ensuring accurate multiplication and steady synapse strength.

Devices 127 and 128 both operate as current sources; that is, the charge on the gates of these devices controls the current flowing through differential pairs 129, 130 and 131, 132, respectively. The drain of device 127 is coupled to the sources of devices 129 and 130. Similarly, the drain of device 128 is coupled to the sources of devices 131 and 132. The drains of devices 129 and 131 are coupled to output line 133, while the drains of devices 132 and 130 are coupled to output line 134. This completes the formation of the four-quadrant multiplier.

In operation, an input signal (shown by V+ and V− lines in FIG. 7) is applied across the gates of each differential pair, i.e., V− is applied to the gates of 129 and 132 and V+ is applied to the gates of 130 and 131. This differential input voltage (V+, V−) is effectively multiplied by a factor representing the difference in charge stored on lines 125 and 126 since this charge difference governs the current flowing through the differential pairs. For small signal inputs the differential output current is proportional to the product of the differential input voltage and the difference in charge on the weight and reference lines. The equations are given in FIG. 7.

$I_{De}$ (exciting current) and $I_{Di}$ (inhibiting current) are also shown in FIG. 7 along lines 134 and 133, respectively, coupled to differential amplifier 137. Note that a larger positive charge on the floating gate of device 123 (compared to that of device 124) increases the current $I_{Di}$ which in turn increases the output of amplifier 137. Summing from other cells occurs at the input to amplifier 137, illustrated by lines 135 and 136.

EMBODIMENT OF FIG. 8

Figure 8:
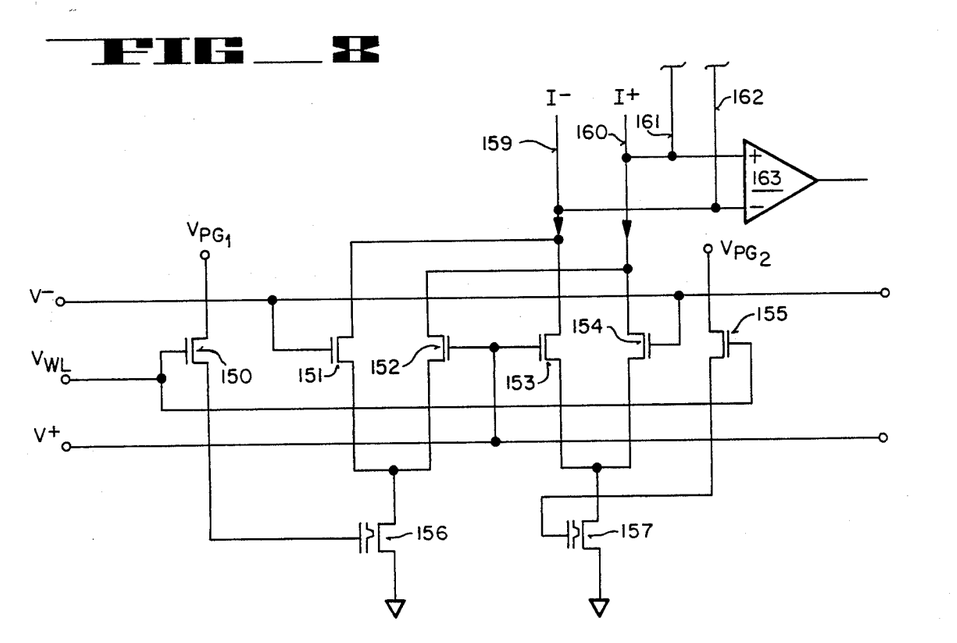
FIG. 8 is an electrical schematic of another preferred embodiment of the invented cell.

The embodiment of FIG. 8 has the additional advantage over FIG. 7 of a much smaller cell size. Devices 123, 170 and 124, 171 have been eliminated. Instead, devices 156, 150, 151 and 157, 154, 155 now perform the multiplication and programming functions.

Referring to FIG. 8, devices 151, 152 and 153, 154 are each differentially-coupled to form the differential pairs of the four-quadrant multiplier, as discussed above for FIG. 7. The sources of devices 151 and 152 are coupled to the drain of device 156, while the sources of devices 153 and 154 are coupled to the drain of device 157. Devices 157 and 156 both have their source regions coupled to $V_{SS}$. The formation of the Gilbert multiplier is completed by having the drains of devices 151, 153 and devices 152, 154 coupled to output lines 159 and 160, respectively. Normally, input V− is applied to the control gates of devices 151 and 154, while V+ is applied to the control gates of 152 and 153.

A weight is modified in a manner similar to that of FIG. 7, but without the need for four of the transistors used to charge and discharge the floating gate devices. To program device 156 the word line $V_{WL}$ (connected to the control gate of devices 150 and 155) and the program line $V_{PG1}$ (connected to the drain of device 150) are raised to high positive potentials. A high positive voltage on the control gate of device 156 causes electrons to tunnel through the thin oxide at its drain and be captured by the floating gate, raising its (programming) threshold. Likewise, electrons may be caused to tunnel onto the floating gate of device 157 by raising the potential on lines $V_{WL}$ and $V_{PG2}$. Device 155 has its drain, control gate and source connected to $V_{PG2}$, $V_{WL}$ and the control gate of device 157, respectively. Either lines V+ and V− are grounded or lines 159, 160 are left floating during programming.

Electrons are removed from the floating gate of device 156 by connecting $V_{WL}$ to a high voltage and $V_{PG1}$ to ground causing the control gate of device 156 to be grounded. The drain of device of 156 is taken to a high voltage by raising V+ and line 160 to a high voltage. It should be obvious that this could also be accomplished by taking V− and line 159 high. This application of a high bias to the drain of device 156, while its control gate is grounded, will cause electrons to tunnel from the floating gate to the drain thereby reducing the (erasing) threshold of device 156. In a manner similar to that just described, electrons may be caused to tunnel out of the floating gate of device 157.

As discussed above in connection with FIG. 7, the multiplication factor, i.e., weighting factor, is determined by the difference in charge stored on the floating gates of devices 156 and 157. Devices 156 and 567 are normally fabricated to be identical so as to make the weighting factor (represented by the charge difference stored on their floating gates) impervious to fluctuations in temperature, supply, processing, etc.

As illustrated in FIG. 8, output lines 159 and 160 are coupled to amplifier 163. Summing from other cells occurs at the input to amplifier 163, illustrated by lines 161 and 162.

EMBODIMENT OF FIG. 9

One of the disadvantages of the traditional four-quadrant multiplier approach shown in FIGS. 7 and 8 is the inability to handle large differential input voltages. (Large in this context means a magnitude of input voltage approximately equal to the supply voltage.) The ability to accommodate large differential input voltages is a desirable characteristic of a neural network synapse cell for certain applications. The embodiment of FIG. 9 achieves this objective.

Figure 9:
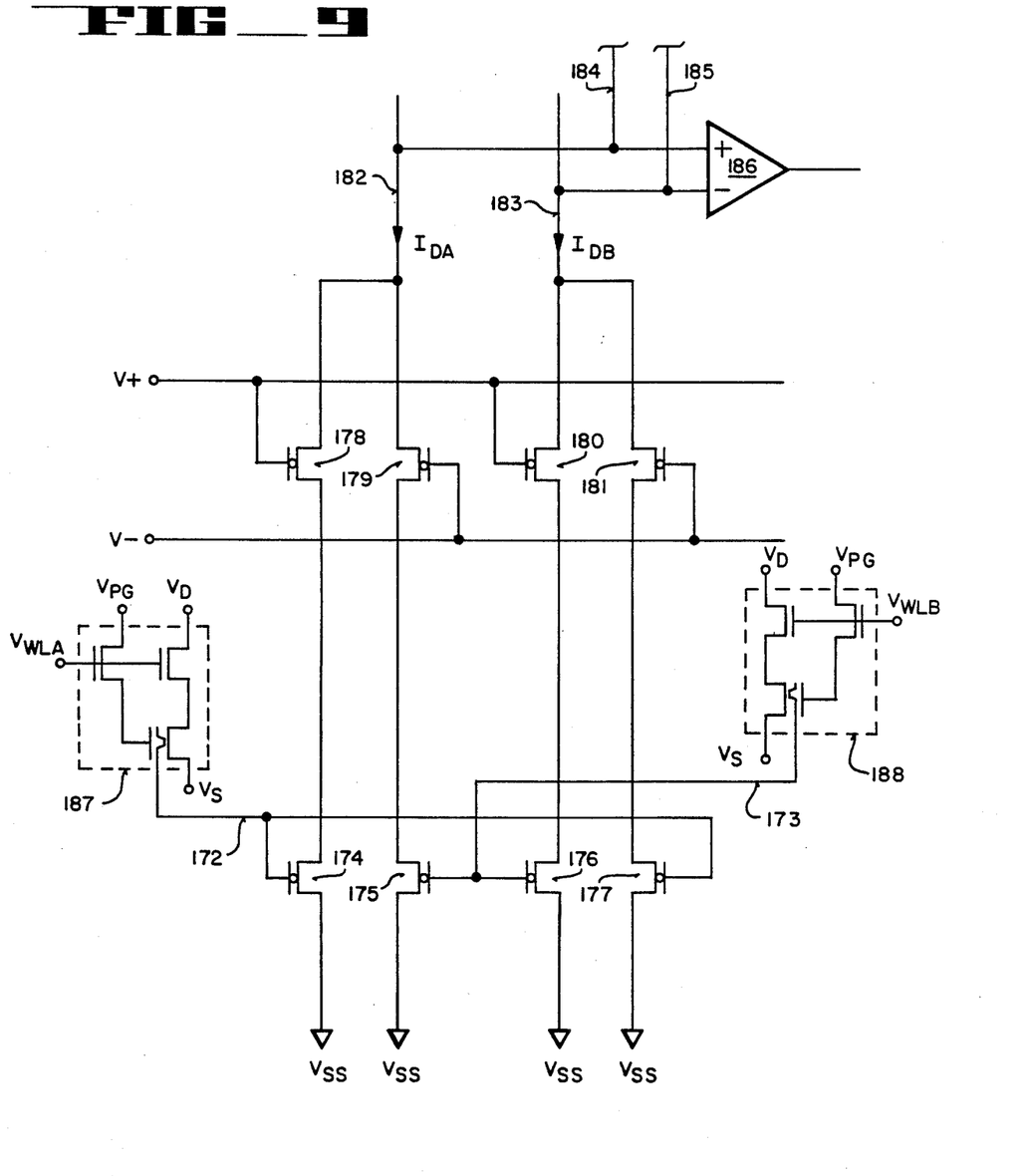

Referring to FIG. 9, the multiplier now comprises field-effect pairs 178, 179, and 180, 181. Devices 174–181 are shown in FIG. 9 as being zero threshold n-channel devices, although zero threshold devices are not essential, they do contribute to improving the linearity of the multiply for input voltages near zero volts. The gate of devices 178 and 180 are coupled to the V+ input line while the gates of devices 179 and 181 are coupled to the V− input line. The drains of devices 178, 179 and 180, 181 are now coupled to output lines 182 and 183, respectively. Device 178 has its source coupled to the drain of field-effect device 174 while device 179 has its source coupled to the drain of device 175. Similarly, field-effect device 180 has its source coupled to the drain of device of 176 and field-effect device 181 has its source coupled to the drain of device 177. The devices 174 through 177 each regulate the current flowing through the associated field-effect devices 178 through 181, respectively. For instance, the current $I_{DA}$ appearing on line 182 is the sum of the current flowing through devices 178 and 179, which in turn is governed by devices 174 and 175. The current $I_{DB}$ is produced in a like manner along line 183.

The sources of devices 174 through 177 are each coupled to $V_{SS}$, i.e., ground potential. The control gate of device 174 and the control gate of device 177 are each coupled to floating gate memory device 187 via line 172. Similarly, the control gates of devices 175 and 176 are each coupled to floating gate memory device 188 via line 173. Devices 187 and 188 are used to charge lines 172 and 173, respectively, to predetermined levels.

The charge present on lines 172 and 173 determines the current flow through each of the differential pairs coupled to the output lines 182 and 183. As explained in connection with FIGS. 7 and 8, the charge difference between lines 172 and 173 represents the factor by which the input is multiplied.

Because the devices 174–177 are operated in the linear mode, the input voltages appearing on V+ and V− may range from zero volts to the supply potential with minimal loss of multiplication linearity. As an example of how the range of linearity is extended by this cross-coupled scheme, consider the case where field-effect devices 178 and 180 have come out of saturation in response to one input extreme. While devices 178 and 180 no longer control currents $I_{DA}$ and $I_{DB}$, devices 179 and 181 will still remain in saturation to maintain linearity in the difference in current between lines 182 and 183. At the other input extreme field-effect devices 178 and 180 will be in saturation, thereby preserving a linear current difference (i.e., multiplication linearity). The differential output current, represented by the difference between $I_{DA}$ and $I_{DB}$, remains a multiple of the differential input voltage and the charge difference between lines 172 and 173 for all inputs from zero volts to the range of the supply voltage.

For purposes of further illustration, consider the following example. Let V+ =5 volts and V− =0 volts so that devices 178 and 180 conduct substantially more current than devices 179 and 181. As the potential on line 172 is raised relative to that of line 173, the devices 174 and 177 will be made more conductive. Thus, more current is available to flow through devices 178 and 181 respectively. However, because device 178 is more conductive than device 181, the increase in current due to the larger charge on line 172 results in an increased current in line 182 relative to line 183.

It is appreciated that the cell of FIG. 9 can also be implemented using floating gate devices for devices 174 through 177, thereby obviating the need for separate field-effect memory devices 170 and 171. Plainly, such an approach would result in a reduced cell size. Programming would take place in a manner similar to that described for FIG. 8.

As shown in FIG. 9, lines 182 and 183 are coupled to differential amplifier 186. Summing from other cells occurs at the input to amplifier 186, illustrated by lines 184 and 185.

Thus, several cells have been described which are particularly suitable for a neural network. The weighting factor is represented by the difference in electrical charge stored on two separate floating gates. The charge typically remains stored on these floating gates for long periods of time, hence, providing non-volatile storage for the weighting factors. The floating gates may be charged, each to a different level, after the circuit is fabricated. The cells readily lend themselves to high density VLSI circuits.

We claim:

1. In a neural network having a plurality of programmable synapses, each of which has a differential input and a differential output, said output being a weighted function of said input, an improved synapse comprising:

a four-quadrant multiplier for receiving said differential input and producing said differential output including a first and a second pair of differentially-coupled, field-effect devices, each of said pairs being connected to a floating gate device, said floating gate device having a floating gate and a control gate, such that the difference in the charge stored on said floating gates determines the current flow through each of said differentially-coupled pairs, thereby causing said output signal to be a multiple of said differential input and said charge difference;

means for charging and discharging said floating gates to predetermined levels.

2. The synapse of claim 1 wherein said predetermined levels may be adjusted.

3. The synapse of claim 1 wherein said four-quadrant multiplier is a Gilbert multiplier.

4. The synapse of claim 1 wherein said means for charging and discharging said floating gates are programmable.

5. The synapse of claim 4 wherein said means includes a programming field-effect device coupled to said control gate for programming of said floating gate device.

6. A method of providing a synapse connection of a desired strength in a neural network comprising the steps of:

charging a first floating gate device to a predetermined weight level and a second floating gate device to a predetermined reference level;

sensing a differential input signal;

multiplying said input signal by a factor represented by the difference in charge between said weight level and said reference level; and providing a differential output signal, which is a multiple of said input signal and said factor, to the differential inputs of a neuron amplifier.

7. The method of claim 6, wherein said charging step further comprises the steps of:

selecting said first floating gate device to be charged;

raising one of a plurality of program lines and one of a plurality of word lines to positive potentials such that charge is transferred onto the floating gate of said first floating gate device, establishing said weight level;

selecting said second floating gate device to be charged;

raising another of said plurality of program lines and another of said plurality of word lines to positive potentials such that charge is transferred onto the floating gate of said second floating gate device, establishing said reference level.

8. In a neural network having a plurality of synapses, an improved synapse for accommodating a large differential input signal and for producing a differential output, said differential output being a weighted function of said differential input signal, the improvement comprising:

a multiplication device including a first, a second, a third and a fourth input field-effect device each associated with, and coupled in series with, a separate control field-effect device, said first and said second input field-effect devices being coupled to one line of said differential output and said third and said fourth input field-effect devices being coupled to another line of said differential output, said first and said third input field-effect devices being coupled to a first line of said differential input signal, said second and said fourth input field-effect devices being coupled to a second line of said differential input signal, said control field-effect devices having a chargeable gate member for regulating the current flow through said associated input field-effect device such that said differential output is a multiple of said differential input signal and the difference in charge between said gate members of said control field-effect devices associated with said first and said second, or said third and said fourth, input field-effect devices;

means for charging said gate members to predetermined levels.

9. The synapse of claim 8 wherein said control field-effect devices are operated linearly to allow a wide range of voltage swings.

10. The synapse of claim 9 wherein said control field-effect devices are floating gate devices and said gate members are floating gates.

11. The synapse of claim 10 wherein said means for charging said gate members are programmable.

12. The synapse of claim 8 wherein said means comprises a first floating gate memory device coupled to said gate members of said control field-effect devices associated with said first and said fourth input field-effect devices, and a second floating gate memory device coupled to said gate members of said control field-effect devices associated with said second and said third input field-effect devices.

13. The synapse of claim 12 wherein said field-effect devices and said control field-effect devices are zero threshold devices.

14. The synapse of claim 13 wherein said means are programmable.

15. In a neural network having a plurality of programmable synapses, each of which has a differential input and differential output, said output being a weighted function of said input and coupled to at least one of a plurality of neuron amplifiers, an improved synapse comprising:

a four-quadrant multiplier for receiving said differential input and producing said differential output to said at least one of said plurality of neuron amplifiers including a first and a second pair of differentially-coupled, field-effect devices;

control means for independently controlling the current flow through each of said differentially-coupled pairs of said multiplier, said control means comprising a pair of floating gate devices, each of said floating gate devices having a chargeable floating gate such that the difference in charge on said floating gates determines said current flow, thereby causing said output signal to said at least one of said plurality of neuron amplifiers to be a product of said differential input and said charge difference.

16. The synapse of claim 15 wherein said control means is programmable.

17. The neural network having a plurality of synapses, an improved synapse for accommodating a large differential input signal and for producing a differential output signal, said output being a weighted function of said input, the improvement comprising:

a multiplication device including first and second field-effect input devices having their drains coupled to a first output line, third and fourth field-effect input devices having their drains coupled to a second differential output line, said first and said third field-effect input devices having their gates coupled to a first differential line and said and said fourth field-effect devices having their gates coupled to a second differential input line, said multiplication device further including first, second, third and fourth pull-down field-effect devices each having their drain coupled to the source of said first, second, third and fourth input field-effect devices, respectively, each of said pull-down field-effect devices having their sources coupled to ground or a similar potential, said first and said fourth pull-down field-effect devices having their gates coupled to a first floating gate device having a chargeable floating gate and said second and said third pull-down field-effect devices having their gates coupled to a second floating gate device also having a chargeable floating gate member, said chargeable floating gate members regulating the current flow through each of said pull-down field-effect devices such that said differential output signal is a multiple of said differential input signal and the difference in charge between said floating gate members of said first and said second floating gate devices;

means for charging said floating gate members to predetermined levels.

18. The synapse of claim 17 wherein said field-effect devices and said pull-down field-effect devices are zero threshold devices.

19. The synapse of claim 18 wherein said means are programmable.

* * * * *